United States Patent
Gutierrez

(10) Patent No.: US 10,291,151 B2
(45) Date of Patent: May 14, 2019

(54) FLEXURE SHEAR AND STRAIN ACTUATOR

(71) Applicant: MEMS START, LLC, Arcadia, CA (US)

(72) Inventor: Roman Gutierrez, Arcadia, CA (US)

(73) Assignee: MEMS START, LLC, Arcadia, CA (US)

(*) Notice: Subject to any disclaimer, the term of this patent is extended or adjusted under 35 U.S.C. 154(b) by 323 days.

(21) Appl. No.: 15/133,142

(22) Filed: Apr. 19, 2016

(65) Prior Publication Data
US 2017/0302197 A1    Oct. 19, 2017

(51) Int. Cl.
*H02N 1/00* (2006.01)
*H02N 1/08* (2006.01)

(52) U.S. Cl.
CPC .............. *H02N 1/006* (2013.01); *H02N 1/08* (2013.01)

(58) Field of Classification Search
CPC ......... H02N 1/002; H02N 1/006; H02N 1/008
USPC .......................................... 310/309; 359/230
See application file for complete search history.

(56) References Cited

U.S. PATENT DOCUMENTS

| | | | |
|---|---|---|---|
| 6,078,016 A | * | 6/2000 | Yoshikawa ......... G01P 15/0802 200/181 |
| 7,982,361 B2 | * | 7/2011 | Maeda ................. B81B 3/0037 310/309 |
| 2003/0173647 A1 | | 9/2003 | Montelius et al. |
| 2003/0197445 A1 | | 10/2003 | Ives |
| 2004/0056742 A1 | | 3/2004 | Dabbaj |
| 2004/0264847 A1 | | 12/2004 | Koh et al. |
| 2007/0278420 A1 | | 12/2007 | Molhave |
| 2008/0180821 A1 | | 7/2008 | Niendorf et al. |
| 2013/0194649 A1 | * | 8/2013 | Zhou ...................... H02N 1/002 359/230 |

OTHER PUBLICATIONS

Patent Cooperation Treaty, International Search Report for PCT/US2017/026457, dated Aug. 11, 2017, pp. 1-4.

* cited by examiner

*Primary Examiner* — Jeremy A Luks
(74) *Attorney, Agent, or Firm* — Sheppard Mullin Richter & Hampton LLP

(57) ABSTRACT

Systems and apparatuses are provided for increasing the possible force and/or travel generated in MEMS devices. For example, comb fingers may be utilized to form a strain actuator to generate larger forces. As another example, the force advantage of a parallel plate actuator is leveraged while also leveraging the travel advantage of comb drives to increase force and/or travel capable of being generated. The systems and apparatuses disclosed may utilize one or more comb drives operationally attached to one or more flexures and/or frames.

7 Claims, 14 Drawing Sheets

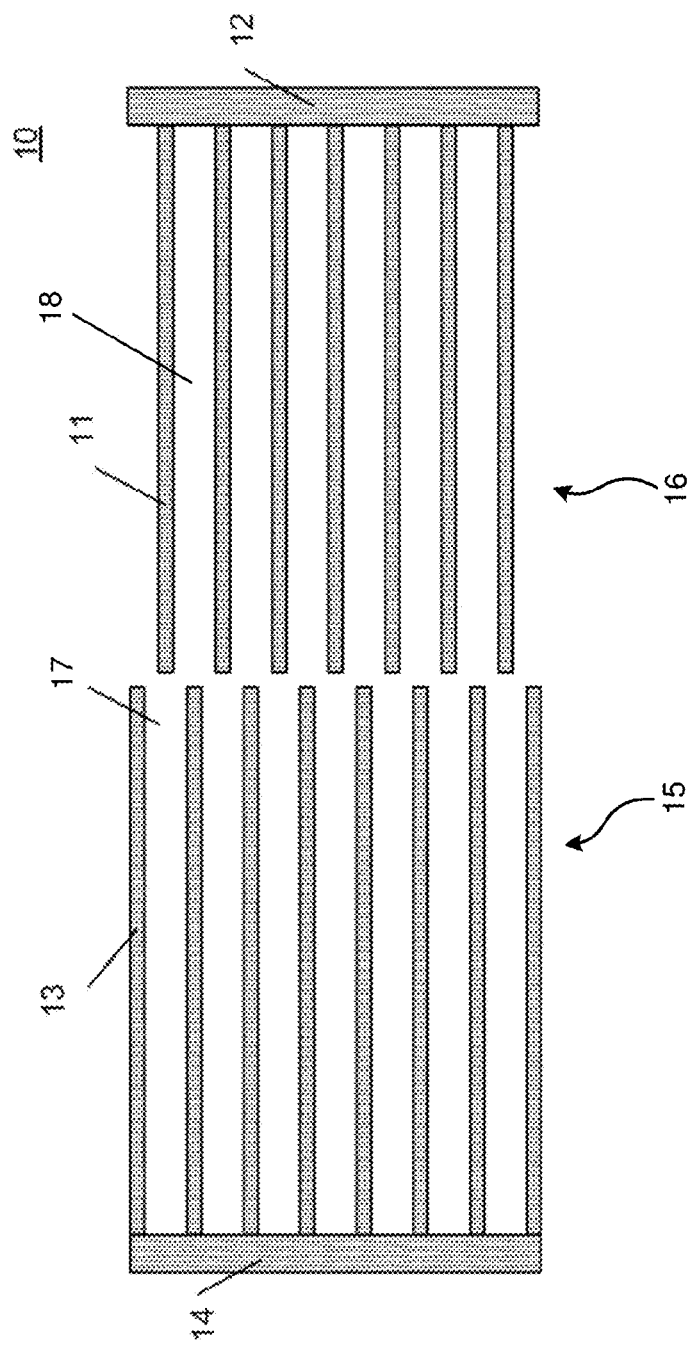
FIG. 1
(CONVENTIONAL)

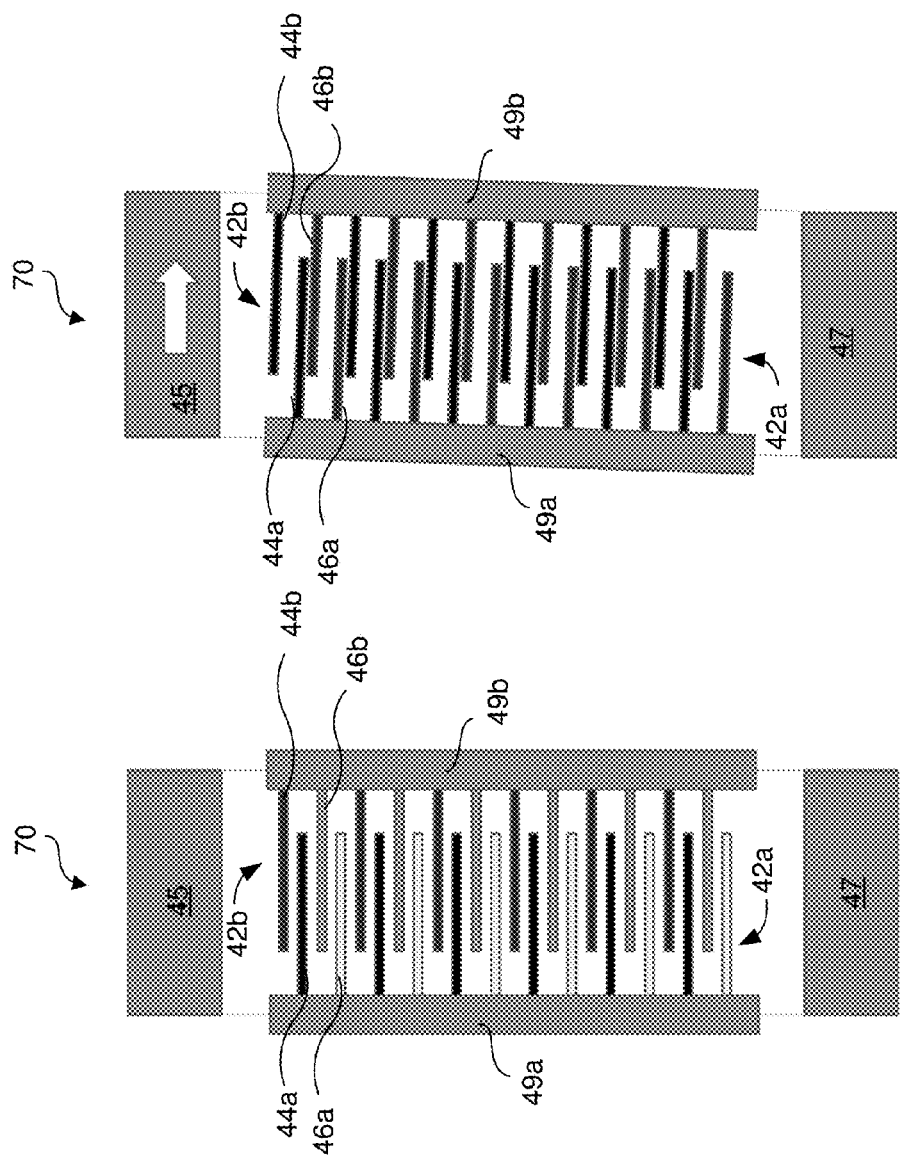

FLEXURE SHEAR AND STRAIN ACTUATOR

TECHNICAL FIELD

This disclosure relates to actuators in general, and in particular, to micro-electro-mechanical-system (MEMS) actuators configured to move a device.

BACKGROUND

Actuators may be used to convert electronic signals into mechanical motion. In many applications, such as, for example, portable electronic devices, miniature cameras, optical telecommunications components, and medical instruments, it may be beneficial for miniature actuators to fit within the specific size, power, reliability, and cost constraints of the application.

MEMS is a miniaturization technology that uses processes such as photolithography and etching of silicon wafers to form highly precise mechanical structures with electronic functionality. MEMS actuators generally function in a similar fashion to conventional actuators but offer some beneficial features over conventional actuators, and are formed using MEMS processes.

BRIEF SUMMARY OF THE DISCLOSURE

In accordance with one embodiment, an actuator comprises a flexure. A first comb array is attached to a first side of the flexure, wherein the flexure is configured to deflect along its length in response to electrification of at least a first set of comb fingers of the first comb array.

In accordance with another embodiment, an actuator comprises a pair of plates oriented parallel to each other, wherein a first plate is fixed and a second plate is moveable. A pair of flexures is oriented parallel to each other and perpendicular to the pair of plates. A shear actuator is operatively connected between the pair of flexures, wherein operation of the shear actuator causes translation of the second plate relative to the first plate and induces shear between the pair of flexures.

BRIEF DESCRIPTION OF THE DRAWINGS

The present disclosure, in accordance with one or more various embodiments, is described in detail with reference to the following figures.

FIG. 1 illustrates a conventional comb drive.

FIG. 7A illustrates an example bi-directional shear actuator in accordance with one embodiment of the present disclosure.

FIG. 7B illustrates movement of the bi-directional shear actuator of FIG. 7A.

Figure 2A:
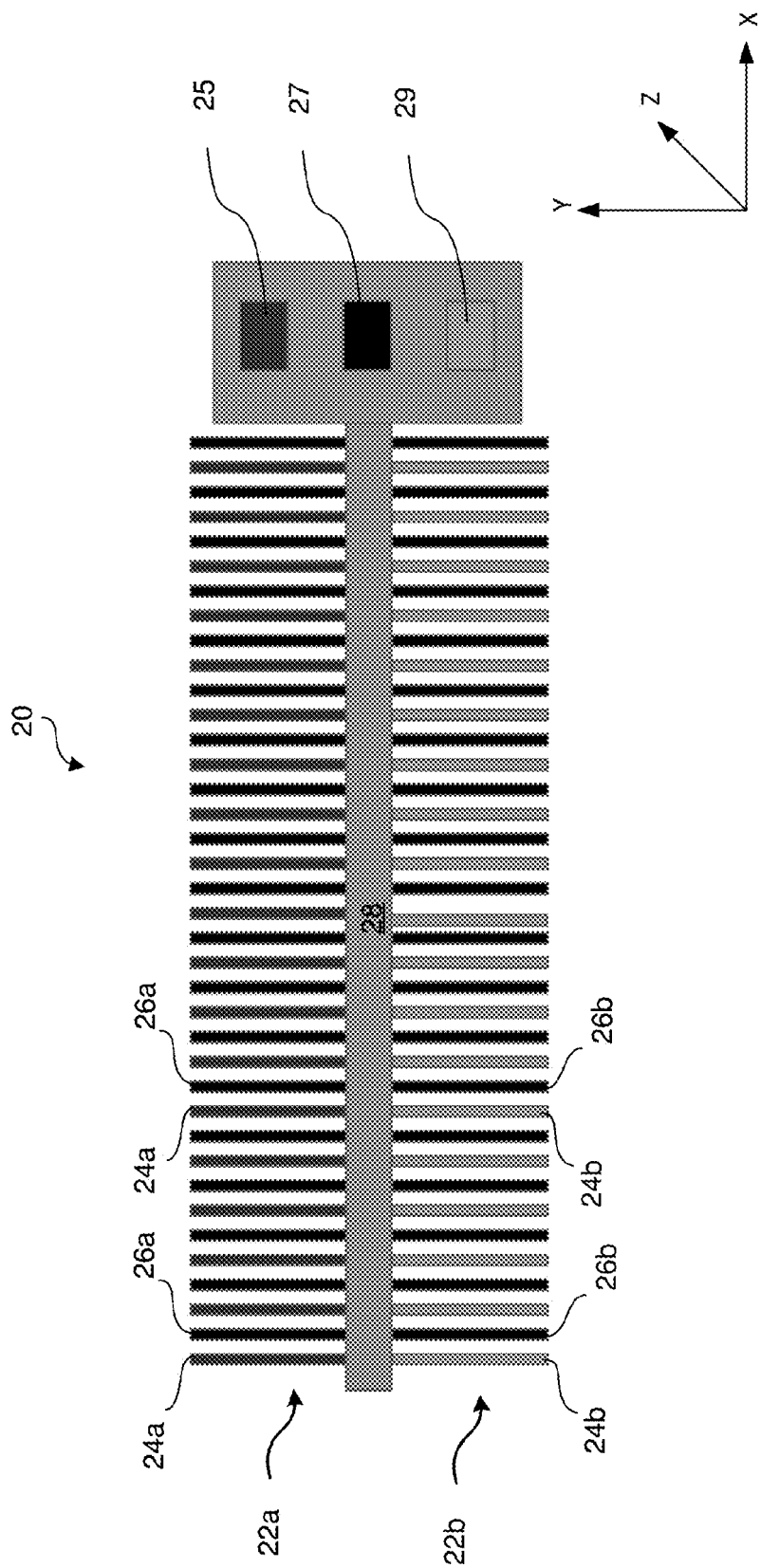
FIG. 2A illustrates an example strain actuator in accordance with one embodiment of the present disclosure.

The figures are provided for purposes of illustration only and merely depict typical or example embodiments of the disclosure. The figures are described in greater detail in the description and examples below to facilitate the reader's understanding of the disclosed technology, and are not intended to be exhaustive or to limit the disclosure to the precise form disclosed. It should be understood that the disclosure may be practiced with modification or alteration, and that such modifications and alterations are covered by one or more of the claims, and that the disclosure may be limited only by the claims and the equivalents thereof. For clarity and ease of illustration, these figures are not necessarily made to scale.

DETAILED DESCRIPTION

The present disclosure is directed to various embodiments of systems, methods, and apparatuses that include a MEMS actuator for moving a device that may include electrical connections. The details of some example embodiments of the systems, methods, and apparatuses of the present disclosure are set forth in the description below. Other features, objects, and advantages of the disclosure will be apparent to one of skill in the art upon examination of the present description, figures, examples, and claims. It is intended that all such additional systems, methods, apparatus, features, and advantages, etc., including modifications thereto, be included within this description, be within the scope of the present disclosure, and be protected by one or more of the accompanying claims.

Some actuators, referred to as comb drives, may utilize electrostatic forces acting between two electrically conductive combs having interspersed comb fingers. When electrical potential energy (charge or voltage) is applied between the two combs, the comb fingers are drawn together, creating attractive electrostatic forces. Generally, the force developed by a comb drive is proportional to the change in capacitance between the two combs, where the force can be increased with increased electrical potential energy, increased number of comb fingers, and/or decreased gap between the comb fingers.

FIG. 1 illustrates a plan view of a conventional comb drive 10, in accordance with example embodiments of the present disclosure. Comb drive 10 may be an electrostatic comb drive. Comb drive 10 may include comb finger arrays 15 and 16, which, by way of example, may be fabricated on silicon using MEMS processes such as photolithography and etching.

As shown in FIG. 1, a first comb finger array 16 includes comb fingers 11 and a spine 12 that connects comb fingers 11 to one another. Similarly, second comb finger array 15 includes comb fingers 13 and a spine 14 that connects comb fingers 13 to one another. Comb fingers 11 and 13 may be inter-digitated, such that comb fingers 11 substantially line up with spaces 17 between comb fingers 13, and comb fingers 13 substantially line up with the spaces 18 between comb fingers 13. Comb fingers 11 and 13, spines 12 and 14, and comb finger arrays 15 and 16 are illustrated in FIG. 1 as having particular shapes, proportions, spatial arrangements, etc., but other shapes, proportions, spatial arrangements, and so on, that may be utilized. For example, while FIG. 1 illustrates comb fingers 11 and 13 without any overlap, comb fingers may be fabricated so that there is overlap.

When a voltage, charge, or electrical potential tension is applied between comb fingers 11 and 13 (or between comb finger arrays 15 and 16), i.e., comb fingers 11 and/or 13, or comb finger arrays 15 and/or 16, are electrified, comb finger arrays 15 and 16 may be attracted to each other with an electrostatic force proportional to, by way of example, the square of the applied voltage (which may be positive or negative as between comb finger arrays 15 and 16). This electrostatic force may cause comb finger arrays 15 and 16 to move toward one another, while a spring restoring force may be used to separate comb finger arrays 15 and 16 from one another. Additionally, the speed with which comb finger arrays 15 and 16 move with respect to one another may depend on the electrostatic force applied. Typically, the design of comb drive 10 is such that comb fingers 11 and 13 may be pulled into an increased overlapping state by the electrostatic force between comb finger arrays 15 and 16 or pulled into a decreased overlapping state by the spring restoring force. When comb finger arrays 15 and 16 overlap, comb fingers 11 reside at least partially within space 17 of comb finger array 15, and comb fingers 13 reside at least partially within space 18 of comb finger array 16.

The ratio of comb finger width to depth may be chosen to avoid a condition commonly referred to as "snap-in," i.e., comb fingers 11 bending or laterally translating into comb fingers 13 when comb fingers 11 and 13 are overlapped. For example, comb fingers 11 and/or 13 may be about 6 micrometers wide by about 150 micrometers long. In general, comb fingers 11 and/or 13 may be between about 1 and 10 micrometers wide and about 20 and 500 micrometers long. The distance between two adjacent comb fingers 11 (or 13) subtracted by the width of one of the corresponding comb fingers 13 (or 11) sets the total gap between comb fingers 11 and 13 when brought into overlap by the electrostatic force. In some instances, it may be desirable for this total gap to be relatively small, in order to increase the electrostatic force between comb fingers 11 and comb fingers 13. In addition, it may also be desirable for the total gap to be large enough to deal with variations in the width of comb fingers 11 and/or 13 that arise from process variations. For example, the total gap may be about 1 to 5 micrometers or larger. In various instances, however, the total gap may be made smaller or larger, as needed. Generally, comb drive 10 may be fabricated with a total gap that is between a minimum and a maximum value, but during motion, the total gap may vary between the minimum and maximum values. In one particular implementation of the disclosure, the total gap between comb fingers 11 and 13 ranges from a minimum of about 1.5 micrometers to a maximum of about 4 micrometers, though narrower and wider ranges are possible.

The depth of comb fingers 11 and 13 may generally be limited by the particular fabrication process used, and specifically by the etching aspect ratio of that process—this is because it may generally be desirable for the width of comb fingers 11 and 13 on the top to be substantially the same as the width of comb fingers 11 and 13 on the bottom. The depth aspect of comb fingers 11 and 13 is not illustrated in FIG. 1, but would extend into or out of the page. For example, comb fingers 11 and 13 may be about 50 to 250 micrometers in depth. Spaces 17 and 18 may either be etched away entirely, or may be removed by other methods known in the art of MEMS micromachining. Other variations of comb drive 10's length, shape, arrangement, and configuration may be used to achieve differing degrees, directions, and/or precision of controlled forces, various size footprints, and other characteristics, as will be appreciated by one of skill in the art upon studying the present disclosure.

However, with conventional comb drive actuators, the force generated laterally or perpendicular to the longitudinal aspect of the comb fingers (e.g., parallel to spines 12 and 14) is much larger relative to the force generated in the direction of travel along the length of the comb fingers. This can result in the aforementioned snap-in phenomenon which is undesirable in conventional comb drive actuators. In order to avoid snap-in, flexures can be used that contain such lateral motion in order to prevent, e.g., overlapping comb fingers from contacting each other. In other words, a conventional actuator may use flexures to limit movement of the actuator to be substantially along the length of the comb fingers. Referring back to FIG. 1, flexures (not shown) may be used to limit movement of comb drive 10 such that comb finger arrays 15 and 16 only move towards each other (comb finger array 16 moves to the left and comb finger array 15 moves to the right) with having comb fingers 11 and 13 contact each other.

In parallel plate actuators driven with comb drives, lateral travel (perpendicular to the length of the comb fingers) is limited. This is because, as described above, the gap between comb fingers is relatively small, e.g., on the order of about 1 to 5 micrometers. Hence, the travel of a conventional parallel plate actuator is limited to movement within one third of the gap between comb fingers and before snap-in occurs. However, as also mentioned above, force in that lateral direction is high. Accordingly, some embodiments of the present disclosure are directed to utilizing comb fingers to form a strain actuator to generate larger forces. In some embodiments, the force advantage of a parallel plate actuator is leveraged while also leveraging the travel advantage of comb drives (recalling that comb fingers can be, e.g., hundreds of micrometers long).

FIG. 2A illustrates a top view of a strain actuator 20 using comb fingers in accordance with one embodiment. As shown in FIG. 2A, strain actuator 20 can include a first comb array 22a comprising a plurality of comb fingers. Every other comb finger of comb array 22a is connected to one of electrical contact pads 25, 27, and 29 while every other comb finger of comb array 22b is connected to one of electrical contact pads 25, 27, and 29. Each comb finger is further connected to flexure 28. For example, comb fingers 24a may be connected to electrical contact pad 25. Comb fingers 24b may be connected to electrical contact pad 29. Comb fingers 26a and 26b may be connected to electrical contact pad 27.

Strain actuator 20 can be used to induce movement or deflection in a surface or object to which strain actuator 20 is attached. For example, if strain actuator 20 were to be used to move an object, the object could be attached at the distal (moving) end of flexure 28 (which has the greatest range of motion). In some embodiments, a surface could be attached to one or more portions of flexure 28, e.g., in the X-Y plane. In some embodiments, strain actuator 20 could be used to interact with a medium. For example, strain actuator 20 may be used as a leg on a micro-robot, or a flagella to create propulsion in water. The medium may also be light that interacts with a portion of strain actuator 20, where the comb fingers of comb array(s) 22a and/or 22b may be part of a grating where light reflects. As strain actuator 20 moves, the shape of the grating and the spacing between the comb fingers change, which affects how the light is reflected. The medium may also be air, where the movement of strain actuator 20 going back and forth cools strain actuator 20, which may be used as active heat dissipation from a microprocessor. Strain actuator 20 may even interact with sound vibrations in the air, such as to create sound like a speaker.

As further illustrated in FIG. 2A, comb fingers 24a, 26a, 24b, and 26b may be connected to a flexure 28, one end of which (distal from electrical contact pads 25, 27, and 29) is free, one end of which (proximate to or at electrical contact pads 25, 27, and 29) is fixed. The result is a cantilever-like configuration. It should be noted that flexure 28 may be configured such that it is thinner or narrow in the X-Y plane, and thicker or wider in the Z plane.

Figure 2B:
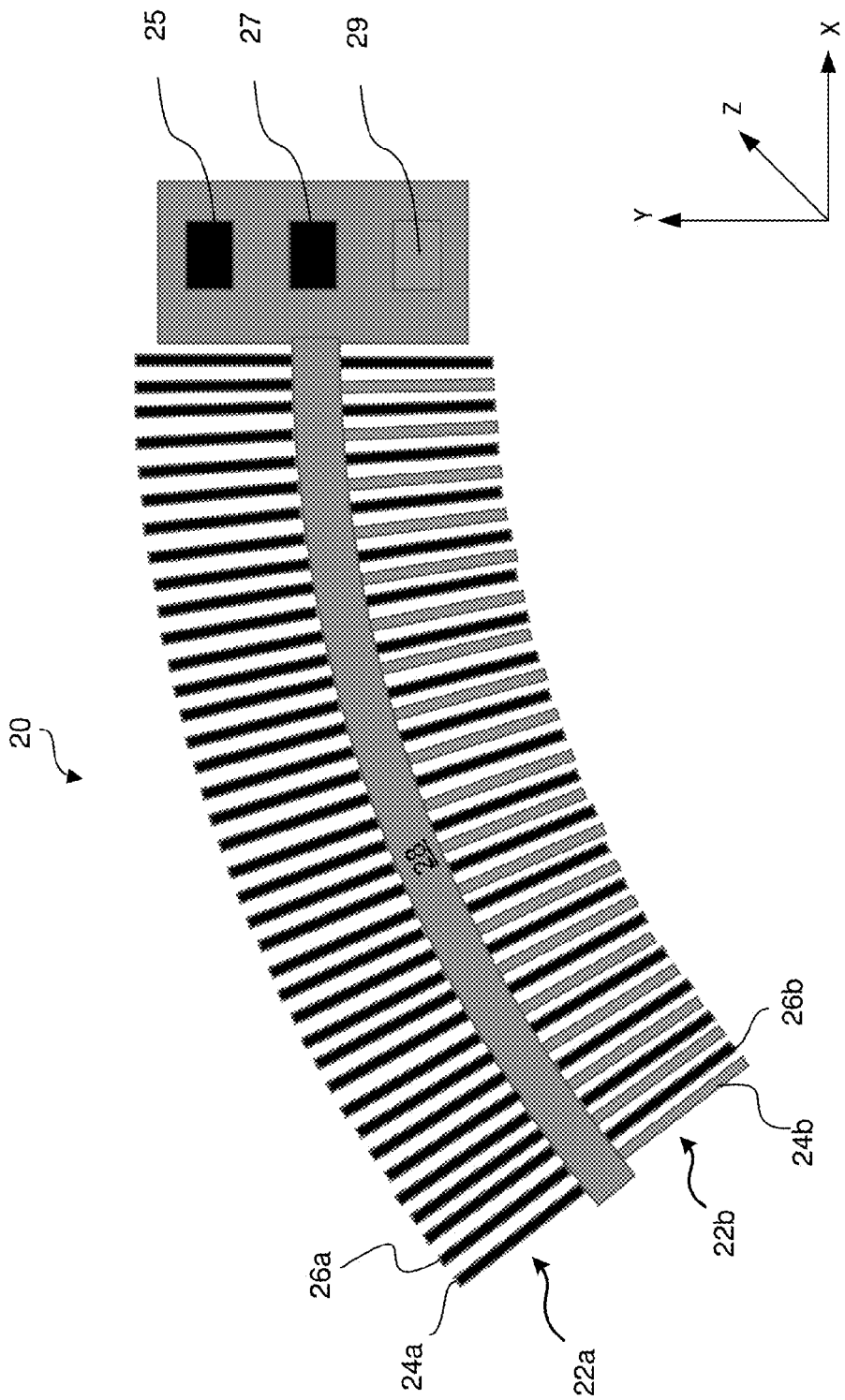
FIG. 2B illustrates the example strain actuator of FIG. 2A in a first deflected state.

FIG. 2B illustrates strain actuator 20 in a bent state. To achieve this bent state, electrical contact pads 25 and 27 may be grounded, while electrifying (e.g., by adding voltage or charge) electrical contact pad 29. In this way, comb fingers 24a and 26a of comb array 22a and comb fingers 26b of comb array 22b are grounded, while comb fingers 24b of comb array 22b are electrified. Thus, comb array 22a has no electrical field. However, a potential is generated between comb fingers 24b and 26b, which causes comb fingers 24b to be attracted to comb fingers 26b, thereby inducing torque or creating a moment on flexure 28. It can be appreciated that this results in flexure 28 bending or deflecting in the X-Y plane compressing comb array 22b, such that the average distance between comb fingers 24b and 26b to be reduced. The amount of voltage or charge added when electrifying contact pads 25 or 27 dictate the amount of deflection experienced by flexure 28.

Figure 2C:
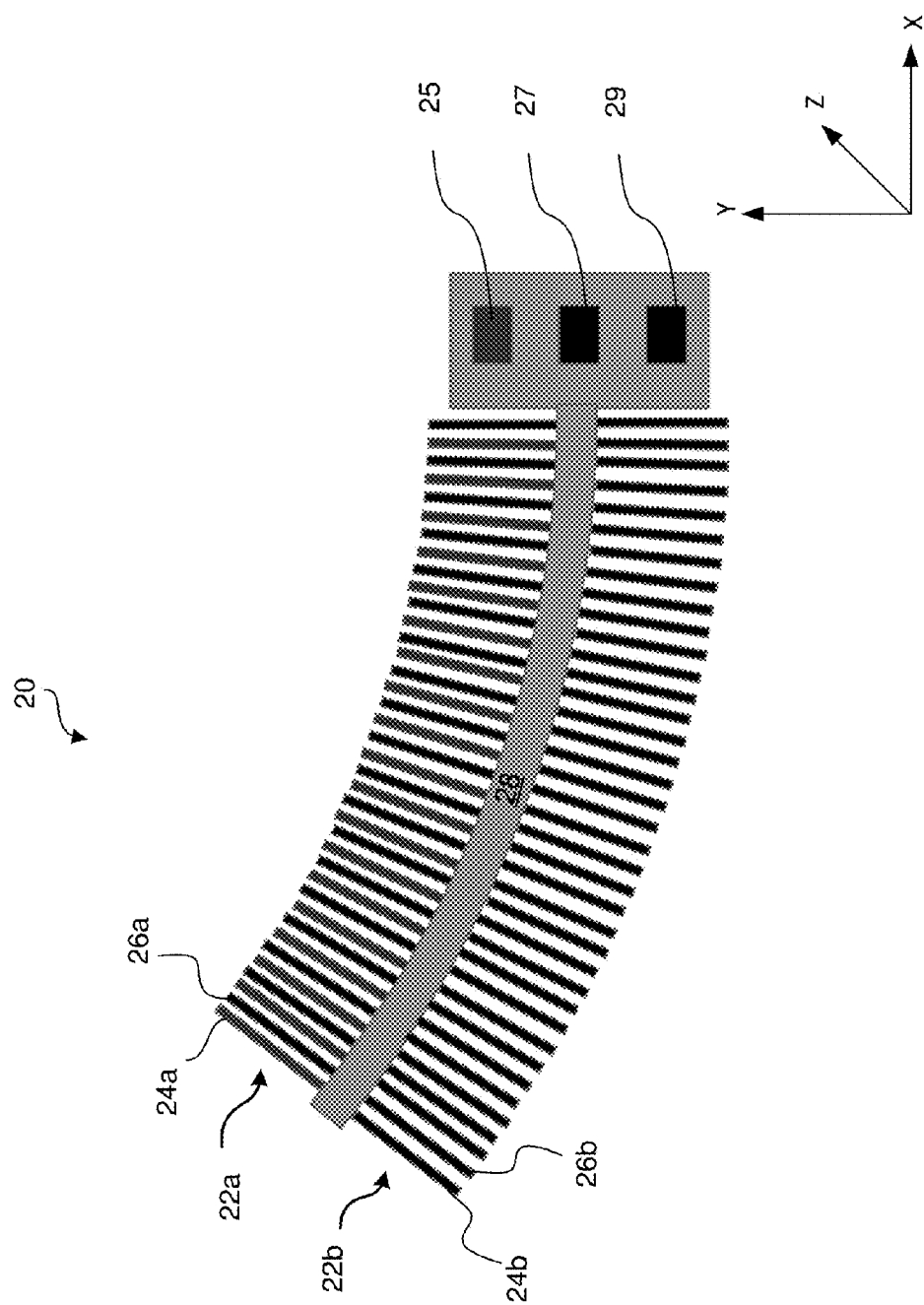
FIG. 2C illustrates the example strain actuator of FIG. 2A in a second deflected state.

By the same token, as illustrated in FIG. 2C, strain actuator 20 can cause flexure 28 to bend or deflect in a substantially opposite direction in the X-Y plane from that illustrated in FIG. 2B. That is, electrical contact pads 27 and 29 may be grounded, while electrifying electrical contact pad 25. In this way, comb fingers 24b and 26b of comb array 22b and comb fingers 26a of comb array 22a are grounded, while comb fingers 24a of comb array 22a are electrified. Thus, comb array 22b has no electrical field. However, a potential is generated between comb fingers 24a and 26a, which causes comb fingers 24a to be attracted to comb fingers 26a, thereby inducing torque or creating a moment on flexure 28. It can be appreciated that this results in flexure 28 bending or deflecting in the X-Y plane along comb array 22a, in a direction opposite that illustrated in FIG. 2B. It should be noted as well as that comb fingers need not necessarily be grounded, in that the controlling factor can be the relative electrical potential between the comb fingers. Accordingly, and for example, comb fingers 26a may set at some reference potential rather than ground.

Figure 3:
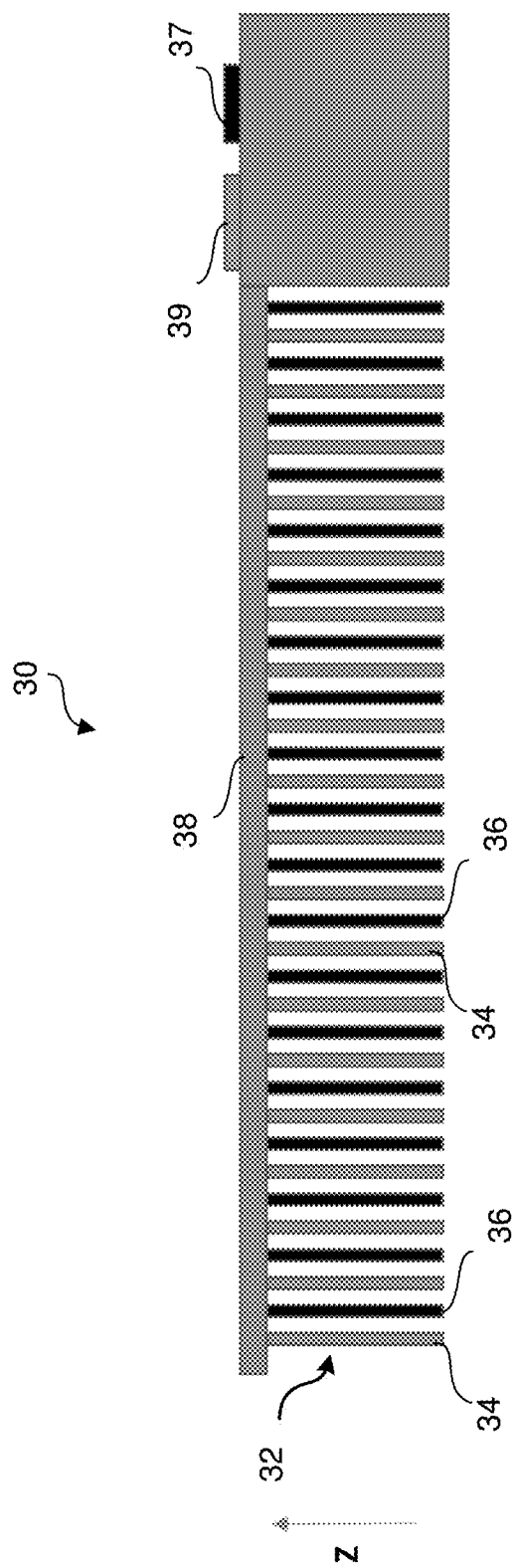
FIG. 3 illustrates an example strain actuator in accordance with another embodiment of the present disclosure.

By alternating the manner in which electrical contact pads 25, 27, and 29 are electrified, which in turn electrifies either comb fingers 24a or comb fingers 24b, flexure 28 can be made to bend or deflect in two directions along the X-Y plane FIG. 3 illustrates a side view of a strain actuator 30 in accordance with another embodiment, where strain actuator 30 is configured to induce movement in the Z-plane. As shown in FIG. 3, strain actuator 30 can include a comb array 32 comprising a plurality of comb fingers. Every other comb finger of comb array 32 is connected to one of electrical contact pads 37 and 39. Each comb finger is further connected to a flexure 38. For example, comb fingers 34 may be connected to electrical contact pad 39. Comb fingers 36 may be connected to electrical contact pad 37.

In contrast to strain actuator 20 illustrated in FIGS. 2A-2C, strain actuator 30 is configured such that comb fingers 34 and 36 are connected to flexure 38 in the Z-axis rather than in the X-Y plane of flexure 38. Moreover, strain actuator 30 utilizes only a single comb array 32, wherein every other comb finger is electrified or grounded using only two electrical contact pads 37 and 39. In this way, grounding comb fingers 36 while electrifying comb fingers 34 can create a potential between comb fingers 34 and 36, which in turn induces a torque or moment along flexure 38, thereby causing flexure 38 to bend or deflect in the Z-axis in the direction of comb array 32, and returning to a non-bent or non-deflected/static state when both electrical contact pads 37 and 39 are held at ground. It should be understood that although FIG. 3 illustrates a single comb array 32, a second comb array can be implemented on the other side of flexure 38, which could be used to induce movement in two directions in the Z-axis.

It should be noted that strain actuators 20 and 30 may also be utilized as a strain gauge or sensor. For example, and referring to strain actuator 30 illustrated in FIG. 3, as flexure 38 bends and comb fingers 34 move due the potential between comb fingers 34 and 36, the capacitance between comb fingers 34 and 36 changes. That is, the nearer comb fingers 34 and 36 become, the more the capacitance between comb fingers 34 and increases, and vice versa. This capacitance, using the appropriate measurement/sensing circuitry and/or logic, may be measured. That is, strain actuator 30 may be fixedly attached, e.g., glued, to a surface (not shown), and the bending or deflection of that surface can be measured capacitively. While conventional strain gauges or sensors can measure the curvature of a surface vis-à-vis measuring the strain/stretch experienced by that surface, by measuring capacitance, the curvature of the surface can be determined directly, and more accurately in some instances because strain is dependent on how thick the surface and/or flexure 38 is. Accordingly, strain actuators configured in accordance with various embodiments described herein can function purely as actuators, purely as sensors, or both as actuators and sensors simultaneously. For example, flexure 38 may be attached to a surface, a voltage may be applied to strain actuator 30, and some force can be applied to the surface. By measuring the resulting curvature in the surface, one or more characteristics or properties of the surface can be determined.

From a mathematical perspective, it should be noted that in order to "fight" a force applied at the distal end of a flexure, e.g., the end of flexure 28 of FIGS. 2A-2C distal from the fixed end (e.g., proximate to or at electrical contact pads 25, 27, and 29), a force must be applied at the "last" comb finger at that fixed end of flexure 28. That force applied at the last comb finger should be greater than the force applied to the distal end of flexure 28 by a factor of the comb finger length divided by the length of flexure 28. In other words, a torque induced by the force applied at the distal end of the flexure is larger by the length of cantilever, while the torque of a comb finger is smaller because its length is smaller (than that of the flexure). This can be represented by the following equation, where F represents the force applied at the distal end of the flexure, $F_c$ represents the force applied at the last comb finger, l represents the length of the comb finger, and L represents the length of the flexure:

$$\frac{F}{F_c} = \frac{l}{L}$$

By way of example, for an approximately 3 mm long flexure and an approximately 300 um long comb finger/drive (that is approximately 170 um deep), with a gap between comb fingers of approximately 2 um, the travel or amount of deflection experienced by the flexure is approximately 149 um at about 45 V, and the force at the flexure tip is about 11 uN. To get larger force, using, e.g., strain actuator 30 of FIG. 3 (which can be thought of as a "vertical actuator"), a comb finger that is 3 mm wide and 170 um deep, can induce approximately 47 um of travel, where the force at the end of the flexure is about 65 uN. It should be noted that for a vertical actuator, the depth of a comb finger can be referred to as its width, while the length of the comb finger can be referred to as it depth. It should be appreciated that in practical application, adding more comb fingers to a comb drive will add motion, but not force in a significant amount if any.

In some applications, a larger force than can be provided by a strain actuator as described herein may be desired. Accordingly and as alluded to above, in some embodiments, the force advantage of a parallel plate actuator is leveraged while also leveraging the travel advantage of comb drives. In particular, shear is leveraged instead of strain to obtain more force in conjunction with the travel provided by a comb drive. For example, opposing comb drives may be mounted on a parallel motion control stage. As the parallel motion control stage moves, flexures to which the comb drives are attached experience shear, while the gap between respective comb fingers of the comb drives changes. In other words, by attracting the comb drives to each other, shear force can be generated and the parallel motion control stage will move.

Figure 4B:
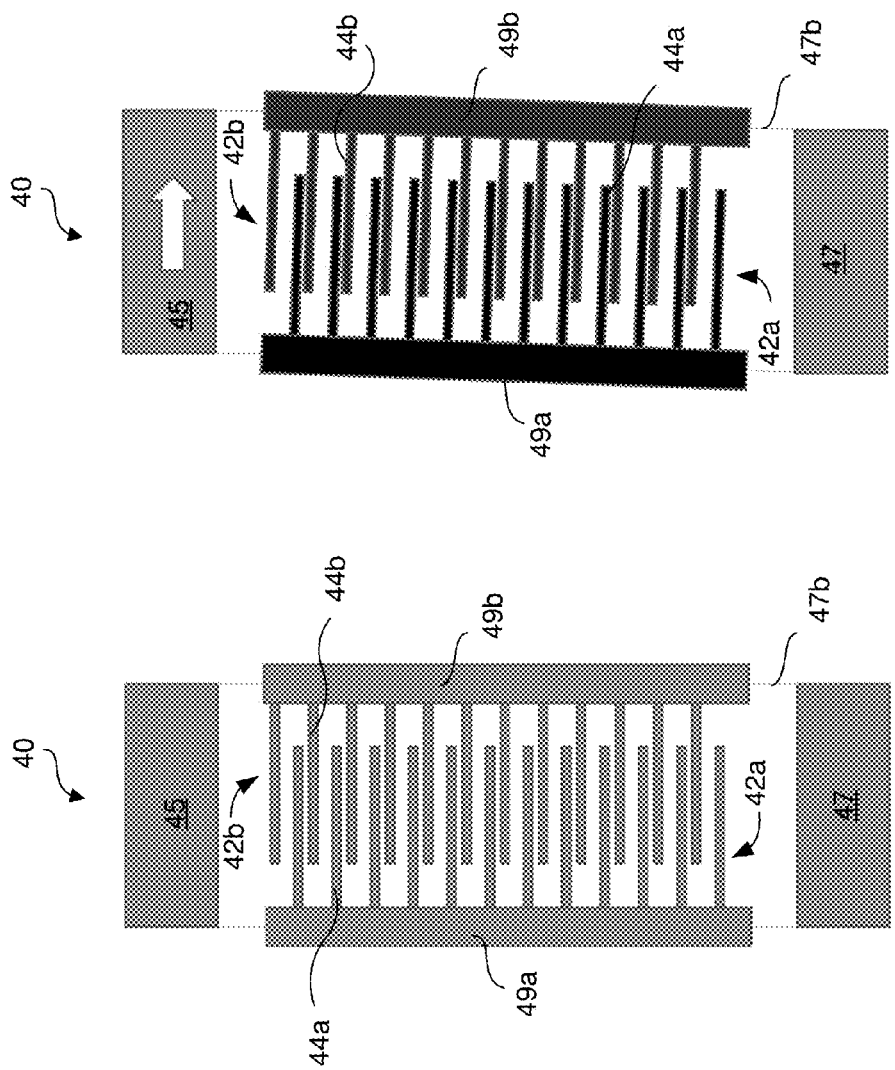
FIG. 4B illustrates movement of the shear actuator of FIG. 4A.
Figure 4A:
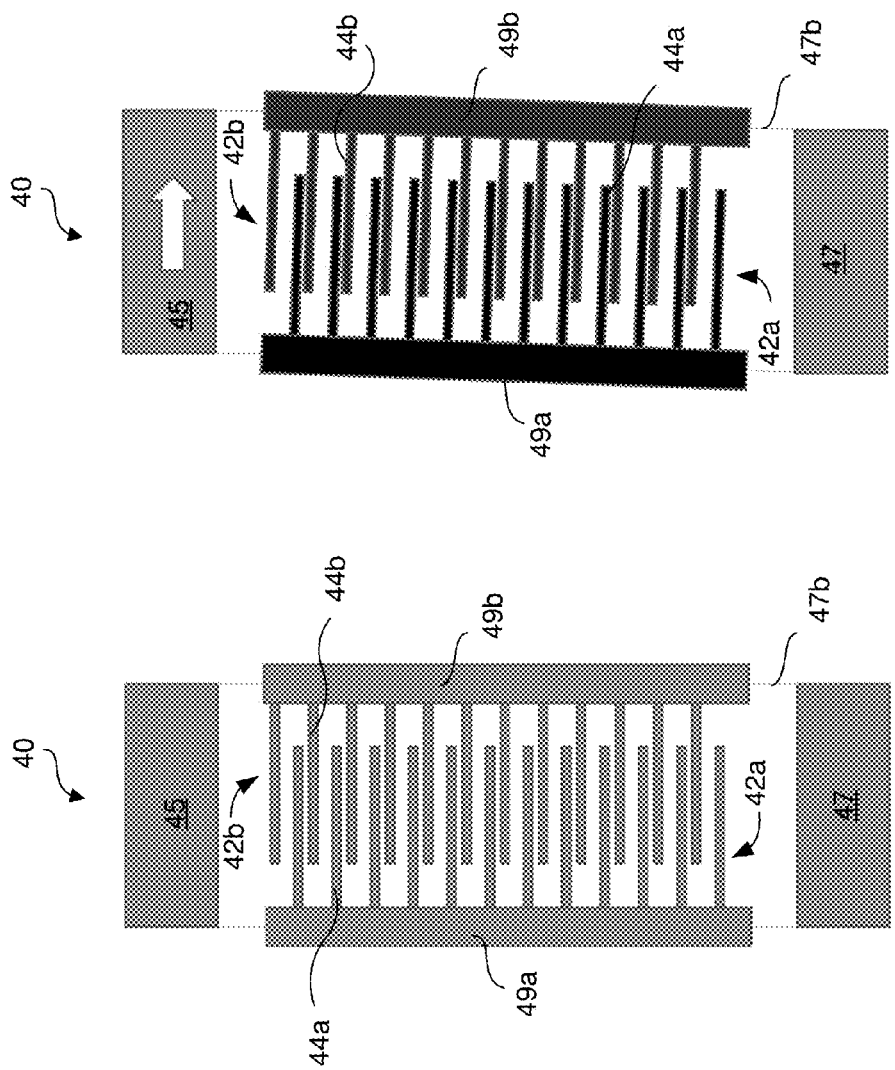
FIG. 4A illustrates an example shear actuator in accordance with one embodiment of the present disclosure.

FIG. 4A illustrates a top view of an example shear drive 40 in accordance with one embodiment of the present disclosure that achieves the desired force and travel described above. In particular, shear drive 40 may also comprise a pair of plates, bases, or frames 45 or 47, one of which may be mechanically fixed or stationary while the other is free to move (in the example illustrated in FIGS. 4A and 4B, plate 47 may be fixed). FIG. 4A illustrates shear drive 40 as also including a parallel motion controlled stage comprising first and second parallel motion control flexures 49a and 49b. It should be noted that although parallel motion control flexures 49a and 49b are illustrated as having a rectangular shape with thin flexures on the ends, parallel motion control flexures 49a and 49b may be configured in other shapes and/or sizes. Moreover, the portion of parallel motion control flexures 49a and 49b to which comb fingers are connected may be rigid, while the portions of parallel motion control flexures 49a and 49b that connect to base 45 and 47 may be flexible, e.g., portion 47b.

Shear drive 40 further includes interdigitated comb drives implemented between parallel motion control flexures 49a and 49b. The interdigitated comb drives include: a first comb array 42a comprising a plurality of comb fingers, wherein each of the plurality of comb fingers are connected to one of parallel motion control flexures 49a; and a second comb array 42b comprising a plurality of comb fingers, wherein each of the plurality of comb fingers are connected to the other one of parallel motion control flexures 49b. Although not shown, it should be understood that comb arrays 42a and 42b may be connected to respective electrical contact pads for grounding/electrifying comb arrays 42a and 42b.

As illustrated in FIG. 4B, displacement of base or plate 45 (in this example, to the right as shown by the arrow) induces shear between parallel motion control flexures 49a and 49b. Moreover, as a result of this shear, comb fingers of comb arrays 42a and 42b are brought closer together (compared to the static state illustrated in FIG. 4A). Accordingly, when the comb drives are electrified, the comb fingers of comb arrays 42a and 42b are attracted, further causing rotation of parallel motion control flexures 49a and 49b. The comb drives may be appropriately electrified, grounded, or otherwise set to a relative potential to induce movement, similar to comb drives previously discussed. This causes translation of the parallel motion control stage.

An advantage to such a configuration is that the motion of the movable frame 45 is larger relative to the change in gap between comb fingers, which can transform what would conventionally be considered a "low travel" actuator into an actuator with greater travel. It should be noted that, in some embodiments described herein, contrary to conventional comb drives where "snap-in" is an undesirable trait, the attraction between comb fingers nearing the snap-in condition can be desirable inasmuch as the lateral force generated is large (previously discussed above). Thus, a charge drive, similar to that described in U.S. patent application Ser. No. 14/586,307 (incorporated herein by reference in its entirety) may be used in this parallel motion control stage with shear electrostatic actuation to prevent snap-in.

Figure 5:
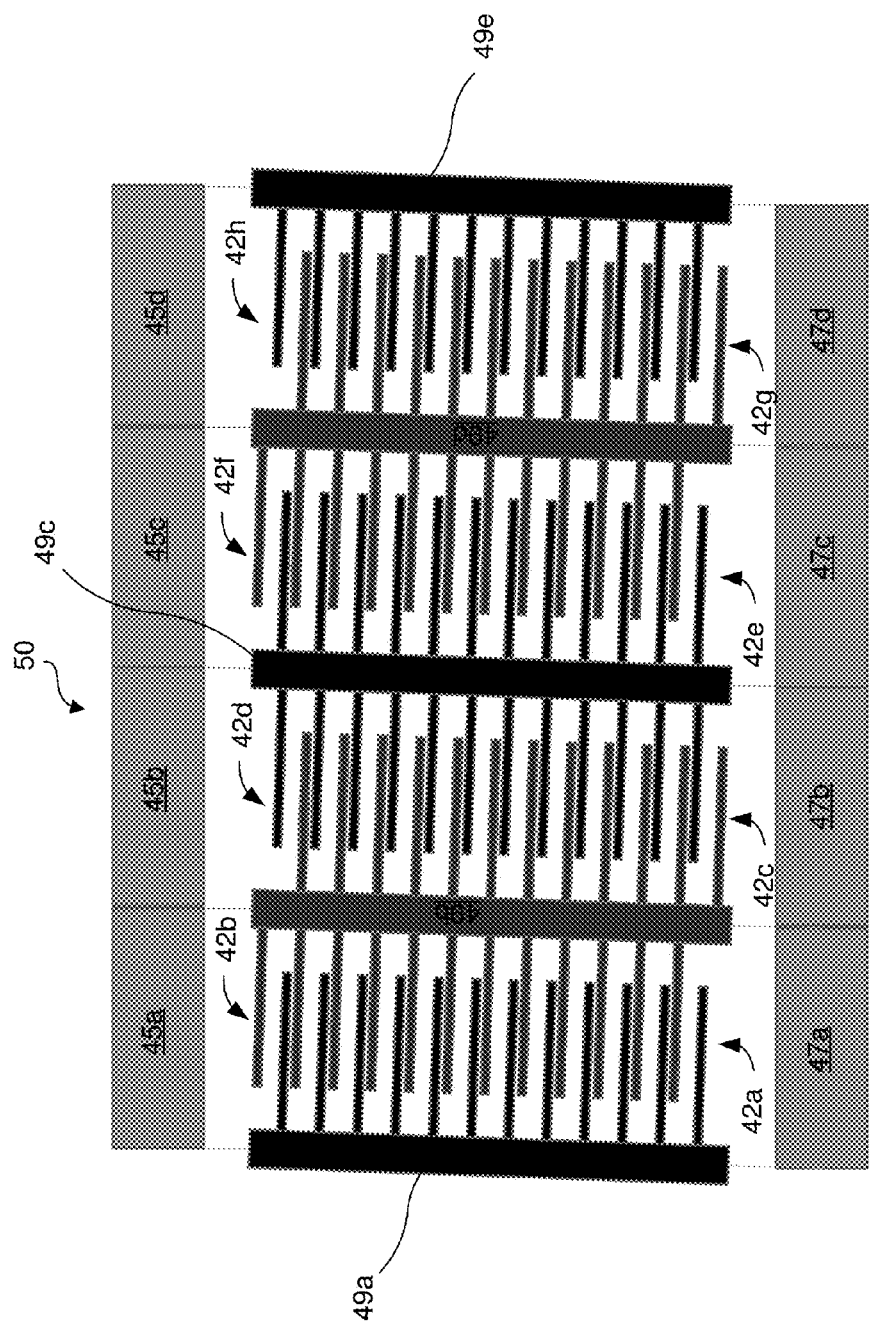
FIG. 5 illustrates an example large shear force actuator in accordance with one embodiment of the present disclosure.

FIG. 5 illustrates a plurality of parallel motion control stages and comb drives working in conjunction with each other as a large force actuator 50. For example, the force generated by actuator 50 at a given electrical potential may be about over ten times larger than that of a traditional comb drive actuator. Alternatively, the shear actuator 50 may be operated at a lower electrical potential than a traditional comb drive while generating the same force. As another example, the force capable of being generated by actuator 50 is about four times that capable of being generated by shear actuator 40 (due to the combination of four shear actuators working in concert). The later calculations illustrate this. As illustrated in FIG. 5, actuator 50 includes four sets of comb drives having comb arrays 42a/42b, 42c/42d, 42e/42f, 42g/42h. In this example configuration, parallel motion control flexure 49b is common to both comb arrays 42b and 42c, parallel motion control flexure 49c is common to both comb arrays 42d and 42e, and parallel motion control flexure 49d is common to both comb arrays 42f and 42g. It should be understood that for parallel motion control flexures 49a, 49b, 49c, 49d, and 49e (which are not located at the edges of actuator 50), any "downward" force generated on one side, e.g., the side of parallel motion control flexure 49b to which comb array 42b is attached, is counterbalanced by a substantially opposite "upward" force generated on its other side, e.g., the side of parallel motion control flexure 49b to which comb array 42c is attached. The use of the terms downward and upward are exemplary and merely reflect the illustrated orientation of actuator 50.

Similar to the single shear drive 40 of FIG. 4B, plates 45a, 45b, 45c, and 45d of actuator 50 may move while plates 47a, 47b, 47c, and 47d may be fixed or stationary. Also similar to single shear drive 40, movement of plates 45a, 45b, 45c, and 45d of actuator 50 induces shear between parallel motion control flexures 49a and 49b, 49b and 49c, 49c and 49d, and 49*d* and 49*e*. Moreover, as a result of this shear, comb fingers of comb arrays 42*a*, 42*b*, 42*c*, 42*d*, 42*e*, 42*f*, 42*g*, and 42*h* are brought closer together. When the comb drives are electrified, the comb fingers of the aforementioned comb arrays are attracted, further causing rotation of parallel motion control flexures 49*a*, 49*b*, 49*c*, 49*d*, 49*e*, which as previously discussed causes translation of the parallel motion control stage.

Due to the utilization of more plates, e.g., four pairs of parallel plates, more force can be generated by actuator 50. Due to the increased number of parallel motion flexures, the stiffness of actuator 50 may be increased. This in turn can increase the resonant frequency of actuator 50 as well.

Figure 6:
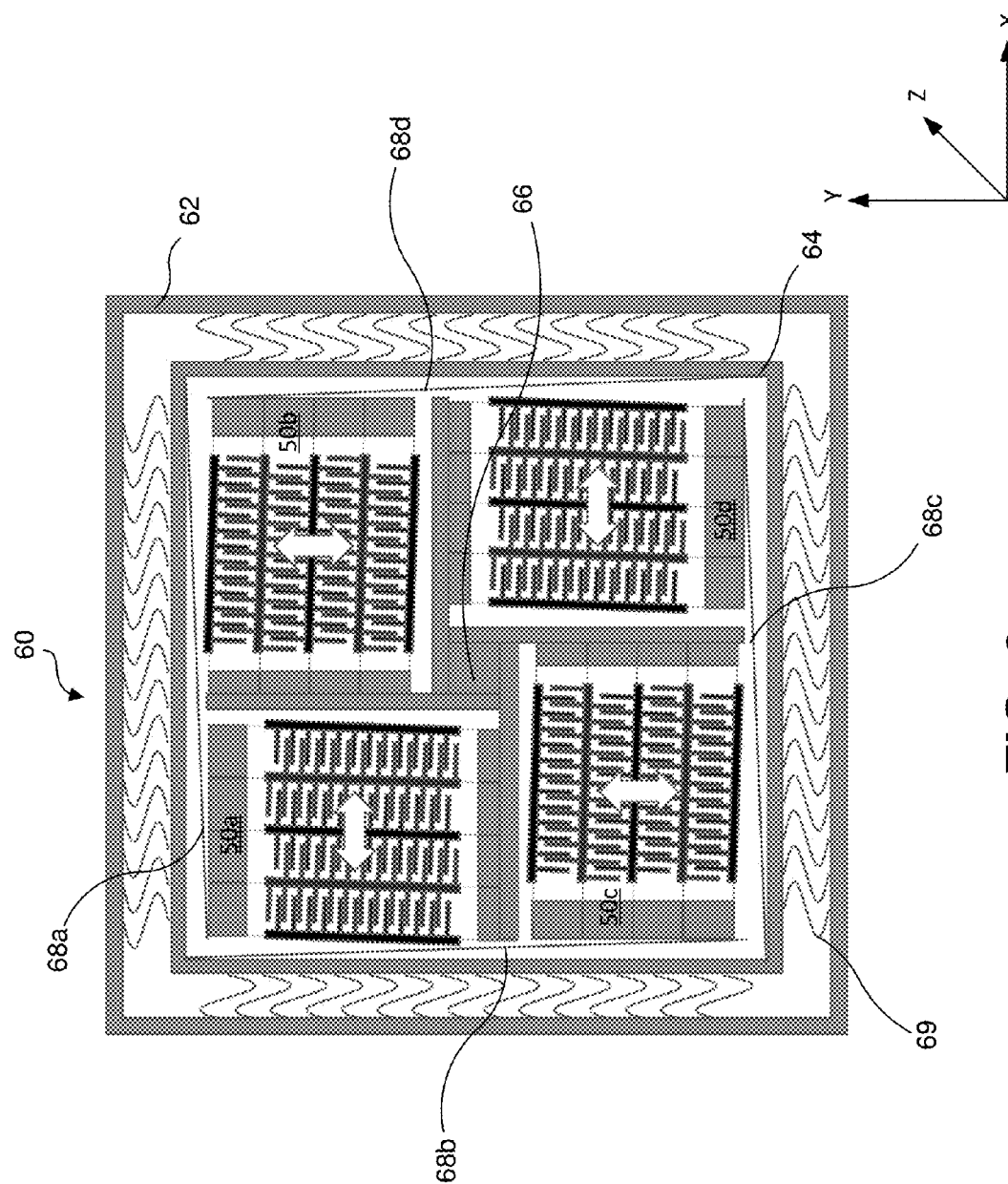
FIG. 6 illustrates an example multi-dimensional actuator in which multiple large shear force actuators are implemented in accordance with one embodiment of the present disclosure.

FIG. 6 illustrates a top view of a multiple degree of freedom actuator 60. Actuator 60 can be made up of, in this example, four of the "ganged up" actuators described above and illustrated in FIG. 5, i.e., large force shear actuators 50*a*, 50*b*, 50*c*, and 50*d*. As illustrated in FIG. 6, one embodiment of actuator 60 includes one or more cantilevers 68*a*-68*d*. Cantilevers 68*a*-68*d* may each include a first end connected to one of large force shear actuators 50*a*-50*d*, and a second end connected to an inner frame 64. One embodiment of actuator 60 may further include an outer frame 62 connected to inner frame 64 by one or more spring elements 69.

Additionally, bidirectional comb drive actuators 50*a*-50*d* are, in one embodiment, connected to anchor 66. Anchor 66 may be rigidly connected or attached to each of large force shear actuators 50*a*-50*d* via their respective fixed plates or bases. Thus, for example, movement of the unfixed plates or bases of each of large force shear actuators 50*a*-50*d* may also be considered movement relative to anchor 66 as well as to their respective fixed plates or bases. In some embodiments the fixed plates or bases may be an integral part of anchor 66.

As described above, large force shear actuators 50*a*-50*d* are capable of generating a relatively large amount of force when compared to traditional comb drive actuators, and this force may be applied between inner frame 64 and anchor 66. Anchor 66 may be mechanically fixed (e.g., rigidly connected or attached) to outer frame 62. In one embodiment, a first platform (not shown) is rigidly connected or attached to outer frame 48 and to anchor 66. In this manner, the first platform may mechanically fix outer frame 62 with respect to anchor 66 (and vice versa). Inner frame 64 may then move with respect to both outer frame 62 and anchor 66, and also with respect to the first platform. In some embodiments, a second platform (not shown) may be rigidly mounted onto the inner frame 64. This second platform may then move with respect to the first platform. In one embodiment, the first or second platform is a silicon platform. In one embodiment the first or second platform is metal. In one embodiment, the first or second platform is ceramic. The first or second platform, in various embodiments, is an optoelectronic device, or an image sensor, such as a charge-coupled-device (CCD) or a complementary-metal-oxide-semiconductor (CMOS) image sensor, or a display, such as an organic light emitting diode (OLED) array or other light emitting diode (LED) array, etc.

The size of actuator 60 may be substantially the same as the size of the first platform, and the first platform may attach to outer frame 62 and anchor 66, thus mechanically fixing anchor 66 with respect to outer frame 62.

The size of the inner frame 64 may be substantially the same as the size of the second platform, and the second platform may attach to the inner frame 64, thus mechanically rigidizing the inner frame 64.

In some embodiments, cantilevers 68*a*-68*d* are relatively stiff in the direction of motion of the respective large force shear actuators 50*a*-50*d*, and are relatively soft in the in-plane orthogonal direction. This may allow for large force shear actuators 50*a*-50*d* to effect a controlled motion of inner frame 64 with respect to anchor 66 and hence with respect to outer frame 62. Outer frame 62, in some implementations of actuator 60, is not continuous around the perimeter of actuator 60, but is broken into two, three, or more pieces, or may not extend all the way around. Similarly, inner frame 64 may be continuous or may be divided into sections, in various embodiments contemplated herein.

As shown in FIG. 6, there may be four large force shear actuators 50*a*-50*d* utilized to effectuate movement and generate force in actuator 60. In one embodiment, two large force shear actuators 50*a*/50*d* actuate in positive and/or negative aspects of a first direction (along the X-axis) in the plane of actuator 60, and two large force shear actuators 50*b*/50*c* actuate positive and/or negative aspects of a second direction (along the Y-axis) in the plane of actuator 60. The first and second directions may be substantially perpendicular to one another in the plane of actuator 60. Various other configurations of large force shear actuators 50*a*-50*d* are possible. Such configurations may include more or less comb drives in each of the large force shear actuators 50*a*-50*d*, and various positioning and/or arrangement of large force shear actuators 50*a*-50*d*, for example, to enable actuation in more or less degrees of freedom (e.g., in a triangular, pentagonal, hexagonal formation, or the like), as will be appreciated by one of skill in the art upon studying the present disclosure. Although different types of actuators are utilized, the configuration of actuators in the above-described embodiment, as well as other actuator configurations, electrical routing and manner of electrifying, materials, etc. utilized in manufacturing and implementing an actuator configured in such a manner are disclosed in U.S. patent application Ser. No. 14/818,086, which is incorporated herein by reference in its entirety. It should be noted that actuator 60 may be capable of approximately one hundred times the force previously realized in prior art actuators.

FIG. 7A illustrates an example bi-directional shear actuator 70 in accordance with one embodiment. As shown in FIG. 7A, bi-directional shear actuator 70, similar to shear drive 40 may also comprise a pair of plates, bases, or frames 45 or 47, one of which may be mechanically fixed or stationary while the other is free to move (in the example illustrated in FIGS. 7A and 7B, plate 47 may be fixed). FIG. 7A illustrates bi-directional shear actuator as also including a parallel motion controlled stage comprising first and second parallel motion control flexures 49*a* and 49*b*. It should be noted that although parallel motion control flexures 49*a* and 49*b* are illustrated as having a rectangular shape with thin flexures on the ends, parallel motion control flexures 49*a* and 49*b* may be configured in other shapes and/or sizes. Moreover, the portion of parallel motion control flexures 49*a* and 49*b* to which comb fingers are connected may be rigid, while the portions of parallel motion control flexures 49*a* and 49*b* that connect to base 45 and 47 may be flexible, e.g., portion 47*b*.

Bi-directional shear actuator 70 further includes interdigitated comb drives implemented between parallel motion control flexures 49*a* and 49*b*. The interdigitated comb drives include: a first comb array 42*a* comprising a plurality of comb fingers, wherein each of the plurality of comb fingers are connected to one of parallel motion control flexures 49*a*; and a second comb array 42*b* comprising a plurality of comb fingers, wherein each of the plurality of comb fingers are connected to the other one of parallel motion control flexures 49b. Although not shown, it should be understood that comb arrays 42a and 42b may be connected to respective electrical contact pads for grounding/electrifying comb arrays 42a and 42b.

As illustrated in FIG. 7B, similar to the embodiment illustrated in FIG. 4B, displacement of base or plate 45 (in this example, to the right as shown by the arrow) induces shear between parallel motion control flexures 49a and 49b. Moreover, as a result of this shear, comb fingers of comb arrays 42a and 42b are brought closer together (compared to the static state illustrated in FIG. 4A). Accordingly, when the comb drives are electrified, the comb fingers of comb arrays 42a and 42b are attracted, further causing rotation of parallel motion control flexures 49a and 49b. As with other embodiments, the comb drives may be electrified, grounded, and or set to some relative potential(s) to cause the comb fingers of comb arrays 42a and 42b to respond appropriately. This causes translation of the parallel motion control stage. However, in this embodiment, pairs of comb fingers may be selected to be electrified to generate movement in two directions (to the left and to the right). In FIG. 7A, gaps between the comb fingers making up comb arrays 42a and 42b are set to be substantially equal in the undeflected state. In FIG. 7B, to move the bi-directional actuator 70 to the right, comb finger pair 44a and 44b are grounded, e.g., by connection to a grounded electrical contact pad (not shown), while comb finger pair 46a and 46b are electrified to the same potential. This results in comb fingers 44a and 46b being attracted, for example. To move in the substantially opposite direction, comb finger pair 46a and 46b are grounded, while comb finger pair 44a and 44b are set to the same potential. It should be noted that in this embodiment, the force generated by bi-directional shear actuator 70 is larger than previously described embodiments because it is not fighting the capacitance in the opposite direction, e.g., there is no potential between comb finger pair 44a and 44b or between comb finger pair 46a and 46b.

Figures 8A, 8B:
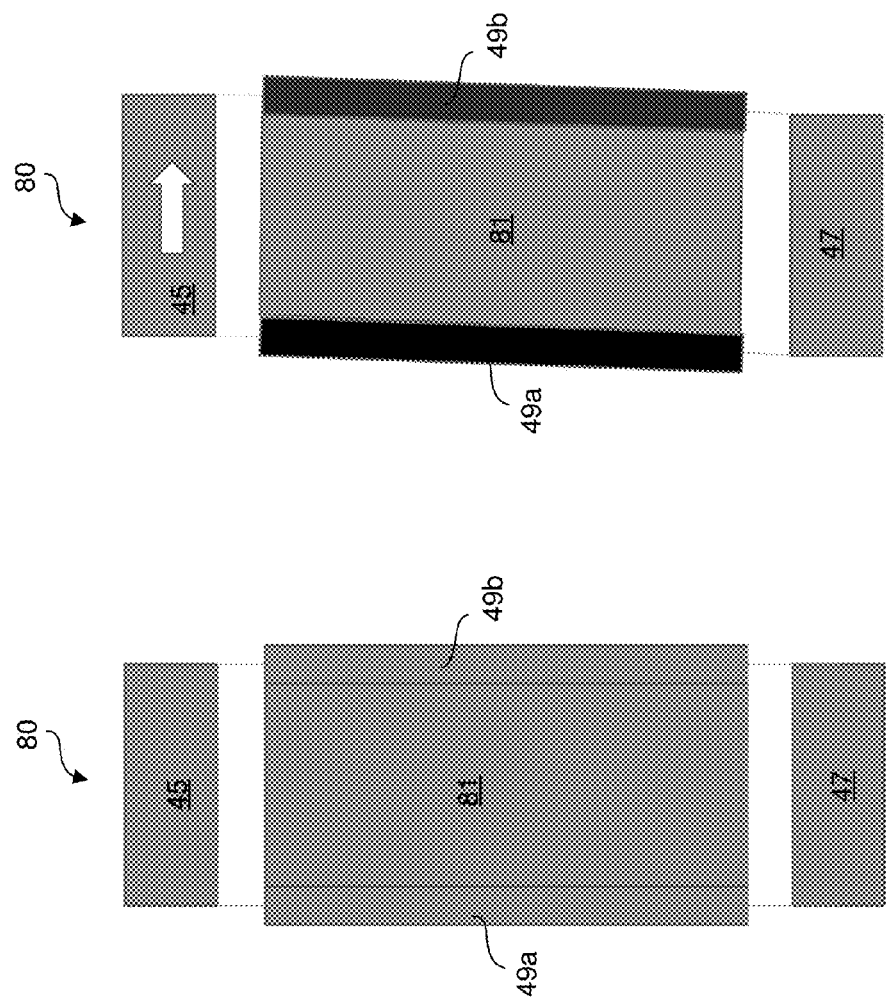
FIG. 8A illustrates an example shear actuator in accordance with another embodiment of the present disclosure.
FIG. 8B illustrates movement of the shear actuator of FIG. 8A.

As illustrated in FIGS. 8A and 8B, shear actuator 80 need not necessarily utilize a comb drive implementation such as the previously described embodiments. That is, the same or similar force/travel can be achieved by utilizing parallel plates/bases 45 and 47, parallel motion control flexures 49a and 49b, but with one or more other types of actuators. For example, actuator 81 may be a piezo, thermal, bimorph, shape memory alloy, or electromagnetic actuator. Still other embodiments are contemplated, where a particular type of actuator, e.g., a comb drive actuator, may be used to cause movement/generate force in a first direction, and another type of actuator, e.g., a shear actuator may be used in another direction. It should be noted that generally, the various embodiments described herein are capable of serving as a well-behaved (i.e., predictable) motion amplification system.

Figure 9:
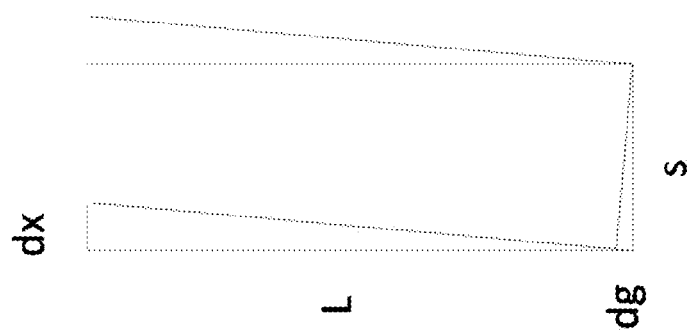
FIG. 9 illustrates a graphical representation of an example shear actuator used for relative force calculations.

From a mathematical perspective, and also referring to FIG. 9, the change in gap between comb fingers of various embodiments disclosed herein may be amplified by a factor equal to the ratio of the length of the parallel motion control flexures and their separation. This can be represented by the following equation, where L represents the length of the flexure, s represents the separation between the flexures, dx represents travel, and dg reflects shear (change in gap between comb fingers):

$$\frac{dx}{dg} = \frac{L}{s}$$

It should be appreciated that the above equation reflects how a change in gap distance between comb fingers can be small, while travel can be relatively large. For example, if flexure length is 6 mm and the length of the comb fingers is 300 um, a 1 um change in gap (2 um down to 1 um) results in 20 um of motion, or 40 um bi-directional motion. A starting force may be 4.3 mN per shear drive, or 43 mN for a 3 mm wide shear drive array with 10 parallel shear drives, which is relatively large when compared to a traditional comb drive occupying the same area. As another example, for 300 um travel, a bi-directional shear actuator (e.g., as described above and illustrated in FIG. 7A) with a 5 um change in gap (e.g. 6 um original gap down to 1 um) and a reduced comb finger length of 200 um, can result in a starting force is 0.14 mN per shear drive, or 2.1 mN for a 3 mm wide shear drive array.

For a charge controlled shear actuator with a gap d between combs, N fingers that have a length 1 and have an area A, and flexures with stiffness $k_x$ and length L, the relationship between travel of the motion control stage x and the charge Q is given by:

$$x(Q) = \frac{lQ^2}{2LA\varepsilon_0 N k_x}$$

$$Q(x) = \sqrt{\frac{2LA\varepsilon_0 N k_x x}{l}}$$

The capacitance C and voltage V as a function of the travel x is given by:

$$C(x) = \frac{A\varepsilon_0 N}{\left(d - x\left(\frac{l}{L}\right)\right)}$$

$$V = \frac{Q(x)}{C(x)}$$

Figure 10B:
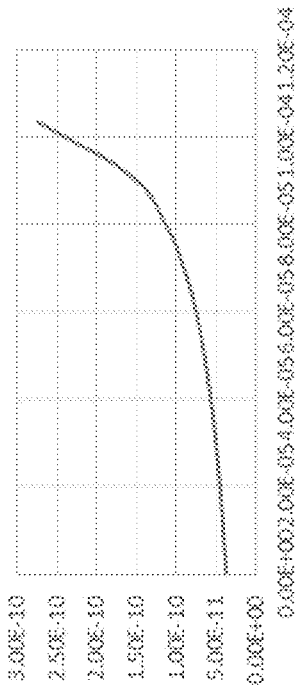
FIGS. 10A, 10B, 10C, and 10D are graphs representative of the behavior and example shear actuator.
Figure 10A:
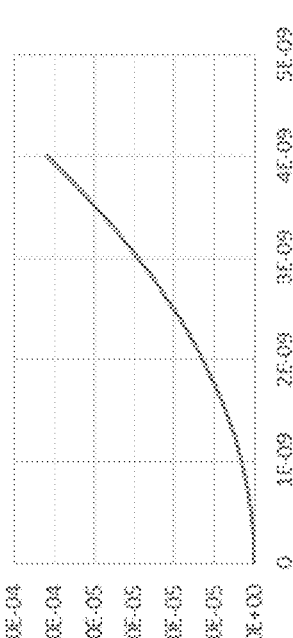

FIG. 10A is a graph illustrating the example behavior of a shear actuator in accordance with various embodiments of the present disclosure. In particular, FIG. 10A reflects a plot of position (meters) versus charge (Coulombs), where it can be seen that the resulting function is well-behaved and continuous, thereby suggesting that, e.g., charge can be used to electrify the shear actuator, and based on that, position can be controlled.

FIG. 10B is a graph illustrating the example behavior of a shear actuator in accordance with various embodiments of the present disclosure. In particular, FIG. 10B reflects a plot of capacitance (Farads) versus charge (Coulombs), where it can be seen that the resulting function is well-behaved and continuous, thereby suggesting that, e.g., charge can be used to electrify the shear actuator, and based on that, capacitance can be controlled.

Figure 10D:
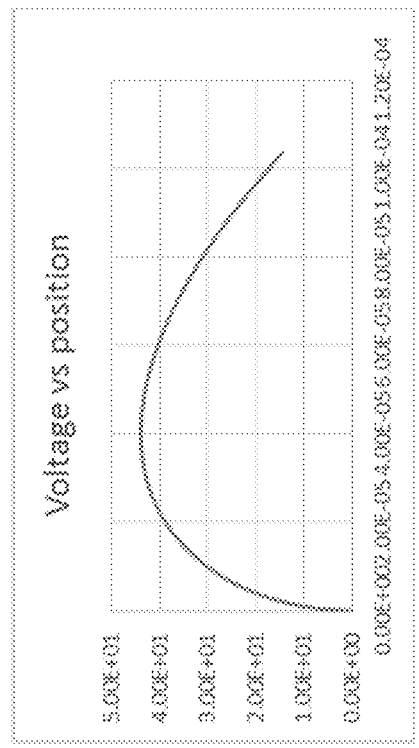
Figure 10C:
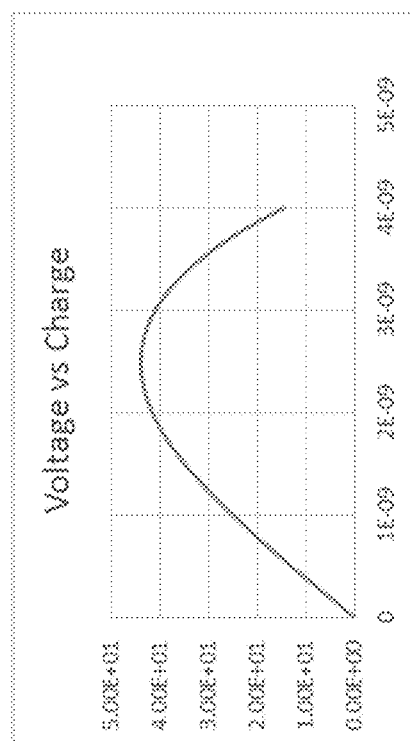

FIG. 10C is a graph illustrating the example behavior of a shear actuator in accordance with various embodiments of the present disclosure. In particular, FIG. 10C reflects a plot of voltage (Volts) versus charge (Coulombs), where it can be seen that the voltage initially increases as charge is added to the actuator and, as charge is further increased, voltage decreases as charge is added to the actuator. This suggest that it is not possible to use voltage to control actuator motion over the entire range of travel. FIG. 10D is a graph illustrating the example behavior of a shear actuator in accordance with various embodiments of the present disclosure that reflects a plot of voltage (Volts) versus position (meters), where it can be more clearly seen that voltage should not be used to control the shear actuator. That is, if utilizing voltage to control the shear actuator, when position is approximately ⅓ of the gap between comb fingers, the voltage required to move further is reduced, eventually resulting in snap-in.

Figure 11:
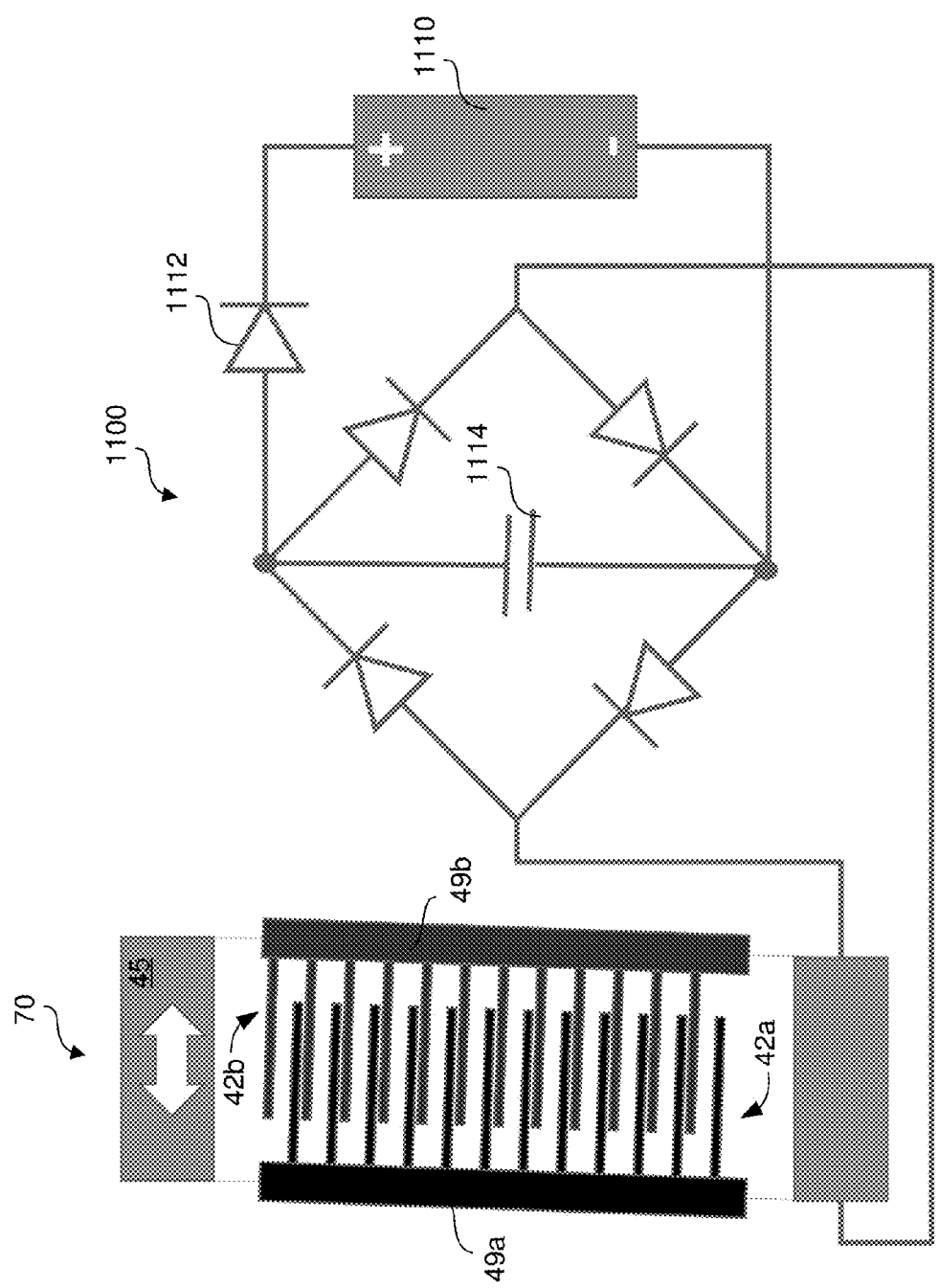
FIG. 11 illustrates an example shear actuator used in an energy harvesting/generating configuration in accordance with one embodiment.

In accordance with still other embodiments, one or more of the aforementioned strain or shear actuators may be utilized as an energy harvesting device. As illustrated in FIG. 11, a shear actuator, e.g., bi-directional shear actuator 70 of FIG. 7A, may be used. Consider that plate or moving base 45 moves back and forth (in the direction of the arrow). By virtue of this movement, there is a variation in the separation between comb fingers (comprising comb arrays 42a and 42b) of the comb drives. Comb fingers can be made to have some stationary charge (e.g., by using an insulator to coat the comb fingers that is charged vis-à-vis the triboelectric effect for charging or by injecting charge into the insulator, e.g., an oxide). As the comb fingers are forced to alternate from moving closer to and farther away from each other, the movement induces a charge flow in and out of the comb fingers (recalling that comb fingers are conductive elements and that one comb drive may be charged with a positive charge and the other with a negative charge). This induces a potential difference between the comb drives. By running the charge through a rectifier (e.g., a bridge rectifier) or other appropriate circuitry, charge will flow into battery 1110 when voltage exceeds battery voltage (diode 1112 blocks flow when voltage is lower that the voltage of battery 1110). It should be noted that instead of battery 1110, a capacitor may be implemented. Additionally, an integration capacitor 1114 may be used (and can receive charge) in order to improve linearity.

The presence of broadening words and phrases such as "one or more," "at least," "but not limited to" or other like phrases in some instances shall not be read to mean that the narrower case is intended or required in instances where such broadening phrases may be absent.

Additionally, the various embodiments set forth herein are described in terms of example block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

While various embodiments of the present disclosure have been described above, it should be understood that they have been presented by way of example only, and not of limitation. Likewise, the various diagrams may depict an example architectural or other configuration for the disclosure, which is done to aid in understanding the features and functionality that can be included in the disclosure. The disclosure is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present disclosure. Additionally, with regard to flow diagrams, operational descriptions and method claims, the order in which the steps are presented herein shall not mandate that various embodiments be implemented to perform the recited functionality in the same order unless the context dictates otherwise.

Although the disclosure is described above in terms of various example embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosure, whether or not such embodiments are described and whether or not such features are presented as being a part of a described embodiment. Thus, the breadth and scope of the present disclosure should not be limited by any of the above-described example embodiments, and it will be understood by those skilled in the art that various changes and modifications to the previous descriptions may be made within the scope of the claims.

What is claimed is:

1. An actuator, comprising:
   a flexure; and
   a first comb array attached to a first side of the flexure, wherein the flexure is configured to deflect along its length in response to electrification of a first set of comb fingers of the first comb array;
   wherein the first set of comb fingers of the first comb array is configured to be electrified to a first potential and a second set of comb fingers of the first comb array is configured to be grounded, alternatingly electrified, or electrified to a second potential different from the first potential.

2. The actuator of claim 1, wherein the flexure comprises a cantilever having a fixed end and a movable end.

3. The actuator of claim 1, wherein each comb finger of the first and second sets of the comb fingers of the first comb array are attached in an alternating fashion along the length of the first side of the flexure.

4. The actuator of claim 3, wherein the flexure is configured to be thicker in a first dimension and thinner in a second dimension, and wherein the first and second sets of comb fingers of the first comb array are attached to the first side of the flexure within the second dimension.

5. The actuator of claim 4, wherein the deflection of the flexure along its length comprises a bending of the flexure in the direction of the first comb array.

6. An actuator, comprising:
   a flexure;
   a first comb array attached to a first side of the flexure, wherein the flexure is configured to deflect along its length in response to electrification of at least a first set of comb fingers of the first comb array, the first set of comb fingers of the first comb array being configured to be electrified to a first potential and a second set of comb fingers of the first comb array being configured to be grounded or electrified to a second potential;
   wherein each comb finger of the first and second sets of the comb fingers of the first comb array are attached in an alternating fashion along the length of the first side of the flexure.

7. An actuator, comprising:
   a flexure configured to be thicker in a first dimension and thinner in a second dimension;
   a first comb array attached to a first side of the flexure, wherein the flexure is configured to deflect along its length in response to electrification of at least a first set of comb fingers of the first comb array, the first set of comb fingers of the first comb array being configured to be electrified to a first potential and a second set of comb fingers of the first comb array being configured to be grounded or electrified to a second potential;

wherein each comb finger of the first and second sets of the comb fingers of the first comb array are attached in an alternating fashion along the length of the first side of the flexure; and wherein the first and second sets of comb fingers of the first comb array are attached to the first side of the flexure within the second dimension.

* * * * *